(12) United States Patent
Abys et al.

(10) Patent No.: US 6,399,220 B1
(45) Date of Patent: *Jun. 4, 2002

(54) CONFORMABLE NICKEL COATING AND PROCESS FOR COATING AN ARTICLE WITH A CONFORMABLE NICKEL COATING

(75) Inventors: Joseph Anthony Abys, Warren; Chonglun Fan, Bridgewater; Igor Veljko Kadija, Ridgewood, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/533,001

(22) Filed: Mar. 22, 2000

Related U.S. Application Data

(60) Division of application No. 09/133,124, filed on Aug. 12, 1998, now Pat. No. 6,090,263, which is a continuation-in-part of application No. 08/660,628, filed on Jun. 6, 1996, now Pat. No. 5,916,696.

(51) Int. Cl.⁷ .................. B32B 15/01; H01L 23/495
(52) U.S. Cl. .................. 428/675; 428/679; 428/929; 428/935; 257/677

(58) Field of Search .................. 428/929, 835, 428/675, 680, 679, 670, 672, 673; 257/677, 666; 439/886

(56) References Cited

U.S. PATENT DOCUMENTS

| 4,411,965 A | * | 10/1983 | Rosengren et al. ......... 428/672 |
| 5,360,991 A | * | 11/1994 | Abys et al. .................. 257/666 |
| 5,650,661 A | * | 7/1997 | Mathew ....................... 257/677 |
| 5,929,511 A | * | 7/1999 | Nakazawa et al. .......... 257/666 |
| 6,037,653 A | * | 3/2000 | Kim et al. .................... 257/666 |

FOREIGN PATENT DOCUMENTS

| JP | 04-255259 | * | 9/1992 |

* cited by examiner

*Primary Examiner*—John J. Zimmerman

(57) ABSTRACT

The present invention is directed to a lead frame in which the metal lead frame substrate is copper, copper alloy, or iron alloy. The lead frame substrate is coated with a conformable nickel coating that is crack-resistant when the lead frame is bent to an angle of at least about 82 degrees with a bend radius of about 100 $\mu$m to about 300 $\mu$m. Bending the lead frame in this manner causes surface deformations in the lead frame substrate. Cracks do not appear through the thickness of the conformable nickel coating of the present invention when the depth of the deformations that result from this bending do not exceed about 5 $\mu$m.

10 Claims, 3 Drawing Sheets

CONFORMABLE NICKEL COATING AND PROCESS FOR COATING AN ARTICLE WITH A CONFORMABLE NICKEL COATING

CROSS-REFERENCE TO RELATED APPLICATION

This is a divisional of application Ser. No. 09/133,124, filed on Aug. 12, 1998, now U.S. Pat. No. 6,090,263 which is a continuation-in-part of U.S. Ser. No. 08/660,628, filed on Jun. 6, 1996 now U.S. Pat. No. 5,916,696.

BACKGROUND OF THE INVENTION

1. Technical Field

The present invention is directed to a nickel coating that is resistant to cracking and a process for forming such a nickel coating onto an article.

2. Art Background

Devices such as integrated circuits are mechanically and electrically connected to larger assemblies via lead frames. The integrated circuit or other device is mechanically mounted on the lead frame, and the device is then electrically connected to the leads on the lead frame. The lead frame is then electrically and mechanically connected to a larger assembly. After the device is mounted on the lead frame, the device is encapsulated for protection. The process for mounting and electrically interconnecting the device to the lead frame and connecting the lead frame to a larger assembly includes steps for device attachment, cure, wirebonding, encapsulation, trim-and-forming and soldering. Some of these steps subject the metal lead frame to mechanical stress and strain. For example, when the leads of the lead frame are formed according to the industrial standard, the forming angle is about 82 to about 90 degrees and the forming radius is about 250 μm.

Lead frames have been formed from a variety of materials. Lead frame materials are selected for their mechanical strength, conductivity, machinability, formability, corrosion resistance, wirebondability, solderability, and thermal expansion. Although gold and palladium have the desired characteristics, the cost of these materials makes their use prohibitive for most applications. Copper and copper alloys also have many advantageous properties that make it suited for this application. A number of different copper alloys are used including alloy 151 (99.9 wt. % copper/0.1 wt. % zirconium); alloy 194 (97.5 wt. % copper/2.35 wt. % iron/ 0.03 wt. % phosphorous/0.12 wt. % zinc); and alloy 7025 (96.2 wt. % copper/3.0 wt. % nickel/0.65 wt. % silicon/0.15 wt. % magnesium). However, the corrosion of the copper in air and the difficulty of forming good soldered connections to copper create the need to use coated copper lead frames. The coating on the lead frame provides corrosion protection and provides a good solderable surface. An iron-nickel alloy, alloy 42 (58 wt % iron and 42 wt % nickel), also has properties that make it useful as a lead frame. However, the corrosion of this metal in air also precludes the use of uncoated alloy 42 as a lead frame material.

Typically, the copper and iron containing materials are coated with nickel to prevent the oxidation of the underlying copper or iron. However, nickel also oxidizes in air, and such oxides are undesirable. A thin layer of a metal that does not oxidize is plated over the nickel to prevent these oxides from forming. Examples of these materials, typically referred to as "noble" metals, include silver, palladium, and gold. These thin coatings range in thickness from about 0.025 μm to about 1.5 μm.

Nickel coatings applied using conventional electrodeposition techniques have a tendency to crack when the lead frame is subjected to the stresses and strains associated with the trim-and-form steps that are discussed above. When the nickel layer cracks, the layer of noble metal thereon also cracks. When these metal coatings crack, the underlying copper or iron alloy oxidizes, corrodes, and migrates to the surface, in the presence of humidity. These surface deposits have an adverse effect on the packaged device. Consequently, a nickel coating for a lead frame that does not crack when the lead frame is subjected to stresses and strains associated with the packaging of electronic devices is required.

SUMMARY OF THE INVENTION

The present invention is directed to a conformable nickel coating that does not crack when a lead frame on which the conformable nickel coating is applied is formed according to the industrial standard, i.e. the forming angle of the leads is at least about 82 degrees with the lead frame with a forming radius of about 250 μm. The forming angle 12 of the lead frame 10 and the forming radius 14 of the lead frame 10 are illustrated in FIG. 1. After forming, the lead frame is coupled to a device, packaged and placed into a larger assembly. The present invention is also directed to a process for forming a conformable nickel layer onto the surface of a metal substrate. Examples of metal substrates include copper substrates, copper alloy substrates, and iron alloy substrates such as iron-nickel alloys.

In the context of the present invention, a conformable nickel layer is a layer of nickel that conforms to the surface of the metal on which the nickel is plated in such a way as to resist cracking even when the coated lead frame is formed according to the standard described above. Forming a lead frame according to the above standard introduces deformations in the lead frame substrate. These deformations are in the form of surface undulations that have a depth of 0.1 μm or more. Examples of substrates that are susceptible to these surface deformations include alloy 151 substrates, alloy 194 substrates, alloy 7025 substrates, and alloy 42 substrates. The thicker the substrate, the more susceptible it is to cracking during forming. The conformable nickel coating of the present invention does not crack when the surface deformations that result from lead frame formation have a depth of less than 5 μm. The thickness of the conformable nickel coating of the present invention is at least about 0.5 μm. It is advantageous if the conformable nickel coating of the present invention has a thickness of at least about 1 μm but less than about 25 μm.

The conformable nickel coating of the present invention has an elongation of at least about 25 percent (measured using ASTM B489-85) when a substrate with the conformable nickel coating is formed according to the industrial standard. This is a substantial improvement over the elongation of prior art nickel coatings. Elongation (sometimes referred to as ductility) is a measure of the degree to which a coating deforms. The greater the elongation or ductility of the coating, the higher its resistance to cracking when the coated substrate is deformed.

In one embodiment of the present invention, a nickel layer that conforms to the substrate in the desired manner is obtained by plating the lead frame in a plating bath that contains about 75 g/l to about 130 g/l of nickel as a nickel complex such as $Ni(NH_2SO_3)_2$ and about 3 to about 5 g/l of a nickel salt such as $NiCl_2 \cdot 6H_2O$. It is advantageous if the plating bath contains about 30 g/l to about 45 g/l of a buffer such as $H_3BO_3$ and about 5 ml/l to about 20 ml/l of a fluorochemical-containing wetting agent (e.g. an aqueous solution containing about 10 ppm of a fluorochemical such as fluorinated alkyl quaternary ammonium iodide). The composition of the bath is controlled so that the pH of the bath is maintained in the range of about 2 to about 2.5.

It is advantageous if the metal impurities in the bath are less than about 30 ppm. Metal impurities are any metals other than the nickel. In one embodiment of the present invention, the nickel is plated onto the metal lead frame substrate using a plating current density of about 5 Amps/$dm^2$ to about 50 Amps/$dm^2$ at a bath temperature of about 50° C. to about 65° C. It is advantageous if the bath is agitated at a speed of about 25 cm/sec to about 60 cm/sec during plating.

After the conformable nickel coating is formed on the lead frame substrate, a layer of a metal that does not oxidize in air is coated over the nickel to provide a solderable surface, because the nickel will oxidize in air and the oxidized nickel does not permit a good, solderable connection to be formed. Examples of such materials include gold, silver, palladium, and palladium alloys. These layers typically have a thickness of about 0.025 μm to about 1.5 μm and are formed on the nickel substrates according to processes well known to those skilled in the art. One exemplary method for forming a palladium layer onto a substrate is described in U.S. Pat. No. 4,911,799 to Abys et al, which is hereby incorporated by reference.

BRIEF DESCRIPTION OF THE DRAWINGS

FIGS. 2A and 2B are in top view and FIG. 2C is in side view.

DETAILED DESCRIPTION

The present invention is directed to a conformable nickel coating for lead frame substrates. The lead frame substrates are typically materials such as copper and its alloys (e.g. alloys 151, 194, and 7025 described above) and iron/nickel alloys such as alloy 42. Deformations with a depth of at least 0.1 μm develop in the surface of these substrates when formed according to the industrial standard. The nickel coating has a thickness of at least about 0.5 μm. It is advantageous if the thickness is at least about 1 μm.

The conformable nickel coating does not crack through its thickness when the lead frame substrate is formed according to standard techniques such as the industrial standard (which requires that the lead frame substrate be bent at least 82 degrees with a forming radius of about 250 μm). One skilled in the art will appreciate that the ability of a coating to resist cracking under such conditions is a function of the aggregate thickness of the coated leadframe and the forming radius (e.g., for a 180 degree bend, $E(\%)=T/D+T\times100$ wherein E is the elongation, T is the aggregate thickness and D is the forming radius). For a given forming radius (D), the elongation to which the coating is subjected increases with increasing thickness (T). There is a physical limit to the amount of elongation a coating can withstand before the coating cracks. Based upon the fact that the substrate thickness is generally at least about 20 μm, and considering the thickness of the other layer(s) of material coated onto the leadframe, conformable coatings with a thickness of less than about 25 μm are crack resistant when subjected to the above-described forming conditions. The conformable nickel coating does not crack when so formed provided that the deformations in the surface of the substrate that are due to forming have a depth of less than 5 μm.

Figure 1:
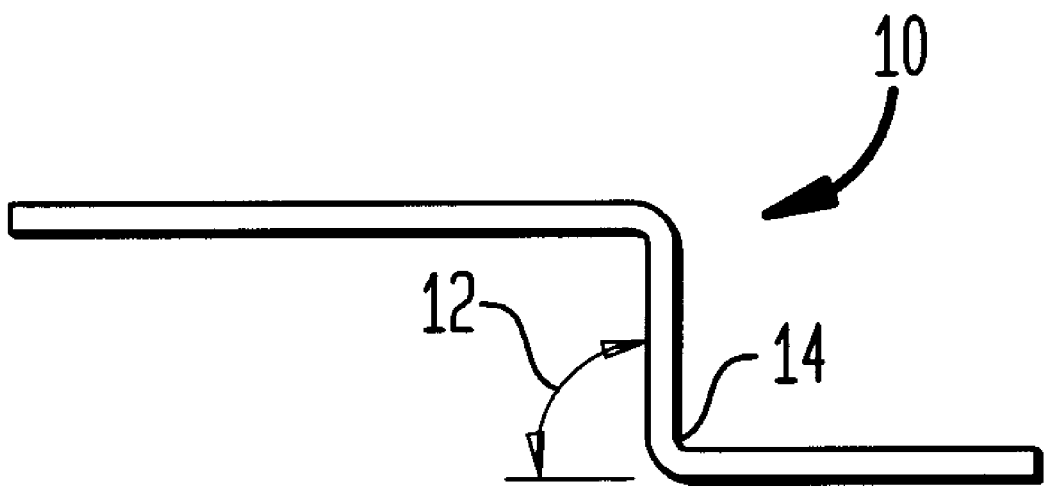
FIG. 1 is a side view of a lead frame after the leads have been formed according to the industrial standard.
Figure 2A:
FIGS. 2A–2C are photographs taken at 200×, 400×, and 1000× of an alloy 194 lead frame that was formed to an angle of about 90 degrees with a curvature radius of about 250 μm.
Figure 2B:
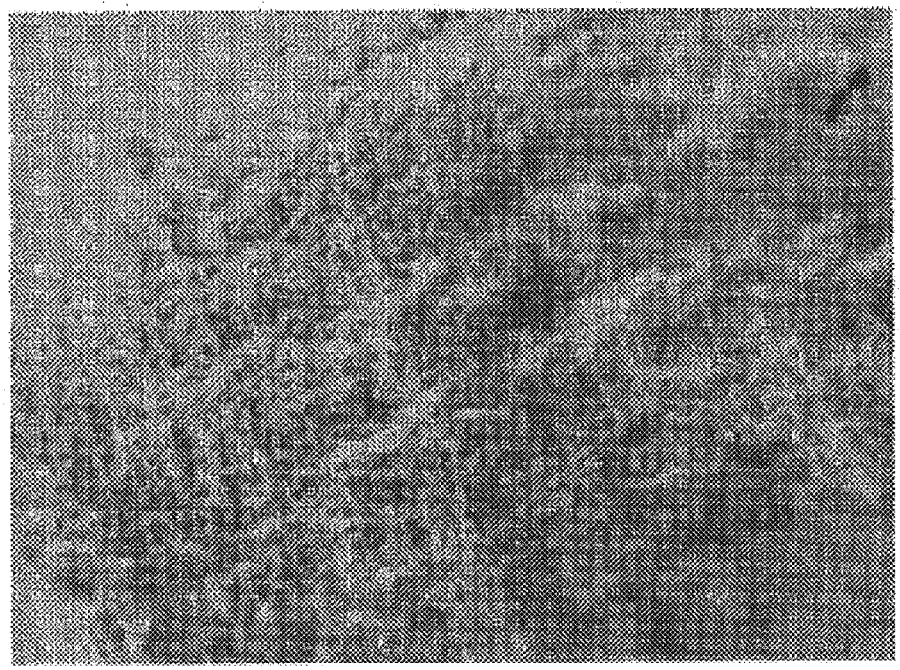
Figure 2C:
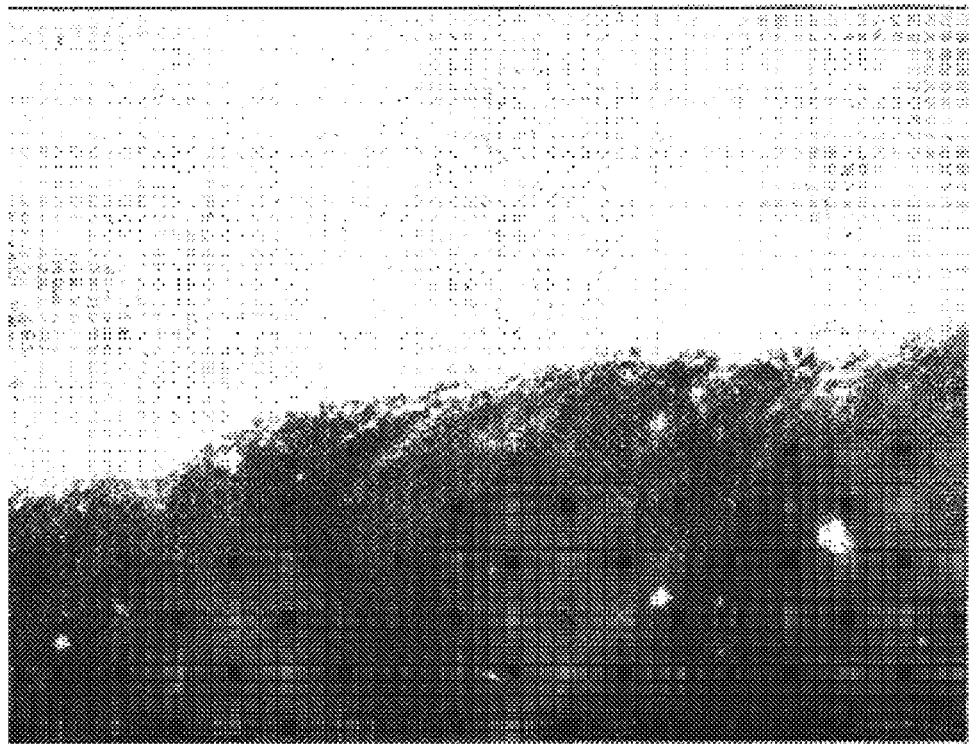

As illustrated in FIGS. 2A–2C, surface irregularities (typically referred to as "orange peel") appear in the lead frame substrate when the lead frame is formed according to the industrial standard. FIG. 2A is a photograph of an alloy 194 lead frame that has been formed to an angle of about 90 degrees with a radius of about 250 μm. The photograph reveals, at 200× magnification, the surface irregularities that result from the forming process. FIG. 2B is a photograph of the identical lead frame, but at 400× magnification. Again the "orange peel" irregularities are clearly revealed in this photograph. FIG. 2C is a photograph of the identical lead frame, but from a side perspective. This photograph, at 1000× magnification, reveals troughs with a depth of up to 3 μm in the surface of the lead frame that result from the forming process.

As previously noted, if the nickel coating cracks, the underlying copper will oxidize, corrode, and migrate, in the presence of humidity, through the cracks to the surface of the coated lead frame. Copper corrosion products that form on the surface of the lead frame degrade the solderability and prevent adequate mechanical and electrical connection between the lead frame and other components. Consequently, a nickel layer that does not crack when the lead frame is formed is highly desirable.

The conformable nickel coating is formed on the substrate using an electroplating process in which the pH of the bath is maintained in the range of about 2 to about 2.5. The metal lead frame is placed in an electroplating bath containing a nickel complex and a nickel salt. In one embodiment, the bath contains about 75 g/l to about 130 g/l of nickel as a nickel complex such as $Ni(NH_2SO_3)_2$ and about 3 g/l to about 5 g/l of a nickel salt such as $NiCl_2 \cdot 6H_2O$. The concentration of the nickel complex in the bath is about 320 g/l to about 555 g/l. It is advantageous if the plating bath contains about 30 g/l to about 45 g/l of a buffer such as $H_3BO_3$ and about 5 ml/l to about 20 ml/l of a fluorochemical-containing wetting agent. Examples of such wetting agents are aqueous solutions that contain about 10 ppm of a fluorochemical such as, for example, fluorinated alkyl quaternary ammonium iodide or perfluoro dodecyl trimethyl ammonium fluoride.

It is advantageous if the bath contains less than about 30 ppm of metal impurities. Specifically, it is advantageous if the bath contains less than 20 ppm iron impurities, less than 25 ppm copper, tin, and zinc impurities, and less than 30 ppm lead impurities.

A current density of about 5 Amps/$dm^2$ to about 50 Amps/$dm^2$ is applied to the bath, which is maintained at a temperature of about 50° C. to about 65° C. to plate a layer of nickel on the lead frame substrate. The thickness of the nickel layer is at least about 0.5 μm. It is advantageous if the nickel layer has a thickness of at least about 1 μm. The current density and plating time required to obtain a nickel layer of a desired thickness are easily determined by one skilled in the art.

Once the nickel layer is formed on the substrate, other layers of material may be formed over the nickel layer to impart desirable properties to the coated lead frame. For example as described in U.S. Pat. No. 5,360,991 to Abys et al., which is hereby incorporated by reference, a layer of palladium strike or gold strike is formed over the nickel layer, followed by a layer of palladium-nickel alloy, followed by a palladium layer. These subsequent layers are largely a matter of design choice. However, as previously noted, it is advantageous for a noble metal layer to be formed over the nickel layer to provide a solderable surface. Since nickel oxidizes in air, and oxidized nickel is not a desirable surface for making electrical connections, it is advantageous if the nickel layer is covered by a layer of material with good conductivity that does not oxidize in air. Palladium, gold, and silver are examples of materials that do not oxidize in air.

The following examples are for illustrative purposes only.

Example 1

A plating bath was prepared by combining 120 grams of nickel as a nickel complex, $Ni(NH_2SO_3)_2$(513 g), 5 grams of a nickel salt ($NiCl_2 \cdot 6H_2O$), and 30 grams of a buffer, $H_3BO_3$. The mixture was then dissolved with water. To this dissolved mixture was added 20 ml of an aqueous solution containing 10 ppm fluorinated alkyl quaternary ammonium iodide. The resulting mixture was then diluted to one liter by volume. The bath temperature was maintained at 60° C. and the bath pH was 2.0 during plating. The bath was agitated at a rate of 25 cm/sec.

The bath was then used to plate nickel on a variety of metal lead frame substrates. In this example, a 7.5 $\mu$m-thick layer of conformable nickel was formed on an alloy 194 lead frame with a thickness of 0.25 mm by applying a current density of 10 Amps/dm$^2$ to the bath for 4.5 minutes. A 0.15 $\mu$m-thick layer of palladium was formed over the nickel layer. The conditions used to plate the palladium layer are well known to one skilled in the art and are described in U.S. Pat. No. 4,911,799 to Abys et al., which is incorporated by reference herein.

The lead frame was then formed according to the industrial standard, i.e. the leads were bent to form an angle of about 90 degrees with the substrate with a radius of about 250 $\mu$m. The lead frame was then observed through an optical microscope at 1000× magnification. Even at this high level of magnification, no cracks were observed through the thickness of the conformable nickel coating.

Example 2

A 7.5 $\mu$m-thick layer of nickel was plated on a lead frame substrate made of alloy 194 with a thickness of 0.25 mm using a commercially available sulfamate nickel plating bath obtained from Witco Corporation. The bath composition contained 75 g/l of nickel as nickel sulfamate (320 g/l), 5 g/l of $NiCl_2 \cdot 6H_2O$, 30 g/l of $H_3BO_3$, combined with enough water to dilute the mixture to one liter. To this was added 0.3 volume percent Barret SNAP A/M (an anti-pit agent) and 7.8 ml/l of Barret SNHA (a hardening agent). The temperature of the plating bath was maintained at 50° C. and the pH was maintained at 4.0. Moderate agitation was used to mix the bath. A 0.15 $\mu$m-thick layer of palladium was formed over the nickel layer (plated as described in Example 1). The lead frame was then formed according to the industrial standard (as described in Example 1).

The lead frame was then viewed under an optical microscope at 1000× magnification. Cracks were observed in the coating. The cracks that form in nickel as a result of the forming process also form in the palladium coated over the nickel layer. As previously mentioned, such cracking is detrimental to the solderability of the lead frame surface.

Example 3

A copper strike was plated over an alloy 42 lead frame having a thickness of 0.15 mm. The copper strike was 0.125 $\mu$m thick and was plated using a current density of 2.6 Amps/dm$^2$. From the same solution, a 4 $\mu$m thick layer of copper was plated over the copper strike. The copper electroplating bath contained 42 g/l of copper cyanide, 66.6 g/l of potassium cyanide, 30 g/l of potassium carbonate, and 60 g/l of Rochelle salt. This is a commercially available copper electroplating bath that is well known to one skilled in the art. The copper bath was maintained at a temperature of 45° C. to 55° C. and a pH of 10.2 to 10.5 during plating. A current density of 1.3 Amps/dm$^2$ was applied for 20 minutes to obtain a coating of the desired thickness. A 2.5 $\mu$m-thick layer of conformable nickel was plated on the copper coated substrate using the conditions described in Example 1. A 0.175 $\mu$m-thick coating of palladium was then applied over the nickel layer plated as described in Example 1. The plated lead frame was then formed in the manner described in Example 1. No cracks were observed when the conformable nickel coating was observed using an optical microscope under 1000× magnification.

Example 4

A copper strike was plated over an alloy 42 lead frame having a thickness of 0.15 mm. The copper strike was 0.125 $\mu$m thick and was plated with a current density of 2.6 Amps/dm$^2$. From the same solution, a 4 $\mu$m-thick layer of copper was plated over the copper strike using the bath composition and plating conditions described in Example 3.

A 2.5 $\mu$m-thick layer of nickel was plated on the copper coated substrate using the bath composition and plating conditions described in Example 2. A 0.175 $\mu$m-thick coating of palladium was then applied over the nickel layer using the bath composition and plating conditions described in Example 1. The lead frame was formed in the manner described in Example 1. The lead frame was then viewed under an optical microscope at 1000× magnification. Cracks were observed through the thickness of the three-layer coating formed on the lead frame.

Example 5

A 0.125 $\mu$m thick layer of nickel strike was plated on an alloy 42 lead frame with a thickness of 0.15 mm using the Wood's Nickel process. In the Wood's Nickel process, the substrate is placed in a bath containing 240 g/l of nickel chloride and 120 ml/l of hydrochloric acid. The bath was equipped with a nickel electrode. The bath pH was 0.6 and the temperature of the bath was ambient. The nickel layer was plated by applying a current density of about 2 Amps/dm$^2$ to about 5 Amps/dm$^2$ for one minute. A 4 $\mu$m-thick layer of copper was then plated over the nickel strike using the materials and conditions described in Example 3. A 2.5 $\mu$m-thick layer of nickel was plated on the copper coated substrate using the commercially available sulfamate nickel plating bath described in Example 2. A 0.175 $\mu$m-thick coating of palladium was then applied over the nickel layer using the bath composition and plating conditions described in Example 1. The lead frame was then formed as described in Example 1 and viewed under an optical microscope at 1000× magnification. Cracks were observed through the entire thickness of the four-layer coating formed on the lead frame.

Example 6

To demonstrate the improvement provided by the conformable nickel coating of the present invention, lead frames prepared as described in Examples 1 and 2 were subjected to standard tests used to determine if a coating is satisfactory. The coated lead frames described in Examples 1 and 2 were subjected to a standard test, MIL-STD-833 (both Method 2003 and Method 2022). Method 2003 is a solderability test, i.e., a "dip-and-look" test to determine if the solder adheres to the coated metal substrate. Method 2022 is a test to determine the wetting speed of the solder. The coated lead frame described in Example 1 passed Method 2003 because the solder covered over 95 percent of the lead frame surface. The coated lead frame described in Example 1 also passed Method 2022 because the wetting time was under one second. By contrast, the lead frame coated with nickel according to the process described in Example 2 failed both of these tests.

The coated lead frames described in Examples 1 and 2 were subjected to a standard test, J-STD-002 (both category 2 and category 3). Category 2 is a one hour steam age before the "dip-and-look" test". Category 3 is an eight hour steam age before the "dip-and-look test". The Example 1 lead frame passed both Category 2 and Category 3 test because the solder covered over 95 percent of the lead frame. By contrast, a lead frame coated with nickel according to the process described in the Example 2 failed both of these tests.

Example 7

The lead frames described in Examples 3–5 were subjected to a test for corrosion resistance (ASTM B-117). During this test, a lead frame is subjected to a salt fog at a temperature of 35° C. for at least 8 hours. The results of this test are summarized in Table 1 below.

TABLE 1

| Lead Frame | After 8 hours | After 24 hours |
|---|---|---|
| Example 3 | <5% rusted (pass) | <5% rusted (pass) |
| Example 4 | 50% rusted (fail) | 100% rusted (fail) |
| Example 5 | 50% rusted (fail) | 100% rusted (fail) |

These results indicate that, non-copper or non-copper alloy lead frame substrates (such as the nickel/iron alloy 42) pass the ASTM B-117 test if a layer of copper is plated over the substrate, and a layer of conformable nickel is plated over the copper. Table 1 demonstrates that alloy 42 substrates were not adequately protected by a copper strike layer, a copper layer, and a non-conformable nickel layer or a nickel strike layer, a copper layer, and a non-conformable nickel layer. Applicants believe that copper layers having a thickness of about 0.5 μm to about 10 μm are suitable if interposed between the lead frame substrate and the conformable nickel layer.

Even after forming, the conformable nickel coating (Example 3) provides a uniform coating over the underlying layer, despite the surface deformations therein. This was determined by viewing the lead frames with an optical microscope at 30× magnification. The lead frame was then subjected to salt spray for 24 hours. No significant amount of rust appeared on the lead frame (observed under 30× magnification), even after being subjected to the corrosive effects of salt spray for 24 hours. The presence of rust indicates that the coating formed on the lead frame has cracks through its entire thickness to the underlying lead frame. This is further evidence that the coating of applicants' invention provided a uniform coating over the underlying substrate, because, since no rust appeared, the conformable nickel coating clearly did not crack. Had the conformable nickel coating cracked, rust would have formed on the lead frame surface after being subjected to the corrosive effects of salt spray for 24 hours as it did for the lead frames coated according to Examples 4 and 5. Specifically, a significant amount of rust was observed to have formed on lead frames plated using the materials and conditions described in Examples 4 and 5 when subjected to the same salt spray and observed under 30× magnification.

Example 8

A variety of substrates were coated with the conformable nickel coating of the present invention using the formulation described in Example 1. These substrates were then formed. The degree of bending was varied from about 90 to about 180 degrees. The surface non-uniformity of these formed substrates was observed and characterized in terms of the depth of the depressions observed in the substrate surface. The conformable nickel coatings were examined to determine if they cracked during the forming process. The following Table 2 summarizes the results.

TABLE 2

| Substrate (alloy) | Thickness (μm) | Bend (degrees) | Curv. Rad. (μm) | Depression (μm) | Crack |
|---|---|---|---|---|---|
| Cu 194 | 200 | 90 | 150 | 2 | no |
| Cu 194 | 200 | 180 | 500 | 3 | no |
| Cu 194 | 250 | 90 | 150 | 2 | no |
| Cu 194 | 250 | 180 | 500 | 3 | no |
| Cu 194 | 250 | 180 | 250 | >5 | yes |
| BeCu | 125 | 180 | 250 | 3 | no |
| Alloy 42 | 150 | 90 | 250 | 2 | no |
| Alloy 42 | 150 | 180 | 875 | 1 | no |

As demonstrated by Table 2, the conformable nickel coating of the present invention resists cracking if the depressions in the lead frame substrate that results from the forming process are less than 5 μm in depth. In this regard, a surface depression is less likely to cause the coating to crack if the coating is thicker than the resulting depression. For example, a 6 μm-thick coating is less likely to crack than a 1 μm-thick coating due to the presence of a 4 μm depression in the lead frame. Consequently, large surface depressions (e.g. greater than 4 μm) have a greater tendency to cause the conformable nickel coatings to crack if those coatings have a thickness in the low part (2 μm or less) of the claimed thickness range.

What is claimed is:

1. A lead frame comprising a substrate made of material selected from the group consisting of copper, copper alloys and iron alloys with a conformable nickel coating thereon comprising a layer consisting of nickel with a thickness of at least about 0.5 μm wherein cracks through the thickness of the nickel layer do not form when the lead frame is bent to an angle of at least about 82 degrees with a forming radius of about 100 μm to about 300 μm when the depth of the surface deformations that appear in the metal substrate as a result of the bending do not exceed about 5 μm.

2. The lead frame of claim 1 wherein the substrate is a metal alloy substrate selected from an alloy in the group consisting of a) 99.9 wt. % copper/0.1 wt. % zirconium, b) 97.5 wt. % copper/2.35 wt. % iron/0.03 wt. % phosphorous/ 0.12 wt. % zinc, c) 96.2 wt. % copper/3.0 wt. % nickel/0.65 wt. % silicon/0.15 wt. % magnesium, and d) 58 wt. % iron/42 wt. % nickel.

3. The lead frame of claim 1 wherein the surface deformations that result when the lead frame is bent have a depth of at least 0.1 μm.

4. The lead frame of claim 1 wherein the conformable nickel coating is formed by placing the lead frame in a nickel bath comprising about 75 g/l to about 130 g/l of nickel as a nickel complex, about 3 g/l to about 5 g/l of a nickel salt, about 30 g/l to about 45 g/l of a buffer, and about 5 ml/l to about 20 ml/l of a fluorochemical-containing wetting agent and maintaining the pH of the bath in the range of about 2 to about 2.5 while applying a current density of about 5 Amps/dm$^2$ to about 50 Amps/dm$^2$ for a period of time sufficient to plate a layer of nickel of the desired thickness onto the substrate.

5. The lead frame of claim 4 wherein the nickel bath is maintained at a temperature of about 50° C. to about 65° C. during plating.

6. The lead frame of claim 5 wherein the nickel bath is agitated at a speed of about 25 cm/sec to about 60 cm/sec during plating.

7. The lead frame of claim 4 wherein the nickel complex is nickel sulfamate and the nickel salt is nickel chloride.

8. The lead frame of claim 7 wherein the fluorochemical-containing wetting agent is an aqueous solution comprising fluorinated alkyl quaternary ammonium iodide.

9. The lead frame of claim 1 wherein the lead frame substrate comprises the alloy 58 wt. % iron/42 wt. % nickel and a layer of copper with a thickness of about 0.5 μm to about 10 μm is interposed between the lead frame substrate and the nickel layer.

10. The lead frame of claim 1 further comprising at least one layer of a noble metal material selected from the group consisting of gold, palladium, silver, and alloys thereof.

* * * * *